United States Patent
Jung

(10) Patent No.: US 8,053,297 B2
(45) Date of Patent: Nov. 8, 2011

(54) METHOD OF FABRICATING A THIN FILM TRANSISTOR USING JOULE HEAT FROM THE GATE ELECTRODE TO FORM A CRYSTALLIZED CHANNEL REGION

(75) Inventor: In-Young Jung, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/906,830

(22) Filed: Oct. 18, 2010

(65) Prior Publication Data

US 2011/0033992 A1      Feb. 10, 2011

Related U.S. Application Data

(62) Division of application No. 11/987,998, filed on Dec. 6, 2007.

(30) Foreign Application Priority Data

Dec. 6, 2006    (KR) .......................... 10-2006-0123078

(51) Int. Cl.
*H01L 21/00*       (2006.01)
*H01L 21/84*       (2006.01)
(52) U.S. Cl. ................................ 438/166; 257/E21.412
(58) Field of Classification Search ........... 257/E21.412; 438/166
See application file for complete search history.

(56) References Cited

U.S. PATENT DOCUMENTS

| | | | |
|---|---|---|---|
| 5,231,297 A | 7/1993 | Nakayama et al. | |
| 5,569,936 A | 10/1996 | Zhang et al. | |
| 5,684,365 A | 11/1997 | Tang et al. | |
| 7,220,993 B2 | 5/2007 | Kim et al. | |
| 7,227,186 B2 | 6/2007 | Tamura et al. | |
| 7,538,348 B2 | 5/2009 | Kato et al. | |

FOREIGN PATENT DOCUMENTS

| | | |
|---|---|---|
| KR | 10-0202122 | 7/1999 |
| KR | 10-0280171 | 11/2000 |
| KR | 10-2006-0018780 | 3/2006 |

*Primary Examiner* — Howard Weiss
(74) *Attorney, Agent, or Firm* — Robert E. Bushnell, Esq.

(57) ABSTRACT

A thin film transistor (TFT) having improved characteristics, a method for fabricating the same, and an organic light emitting display device (OLED) including the same. The TFT is constructed with a substrate, a semiconductor layer disposed on the substrate and including a channel region, source and drain regions, a gate insulating layer disposed on the semiconductor layer, a gate electrode disposed on the gate insulating layer and corresponding to the channel region, an interlayer insulating layer disposed on the gate electrode, and source and drain electrodes electrically connected to the source and drain regions of the semiconductor layer. The channel region is made from polycrystalline silicon (poly-Si), and the source and drain regions are made from amorphous silicon (a-Si). The polycrystalline silicon of the channel region is formed by crystallizing amorphous silicon using Joule's heat generated by the gate electrode.

8 Claims, 9 Drawing Sheets

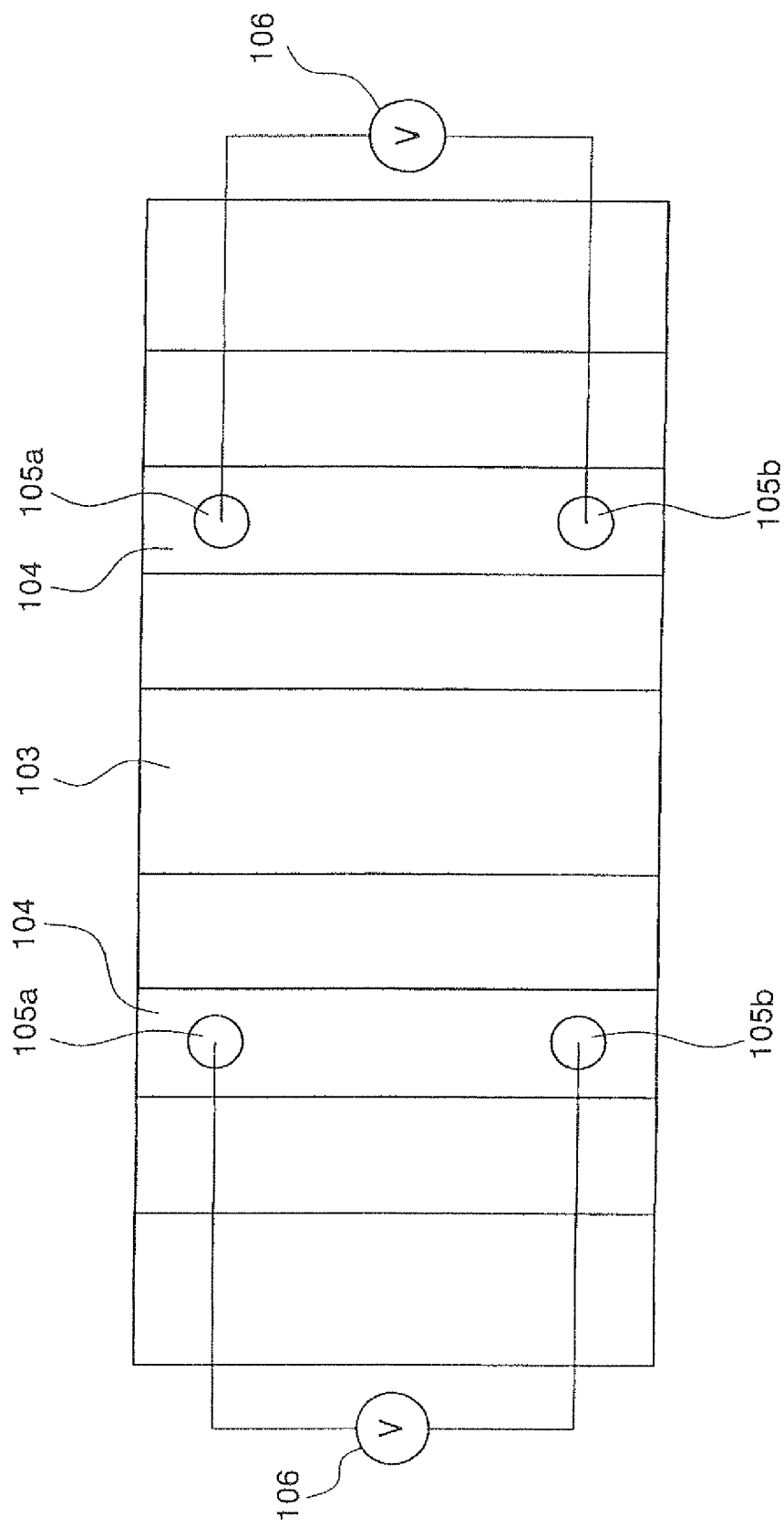

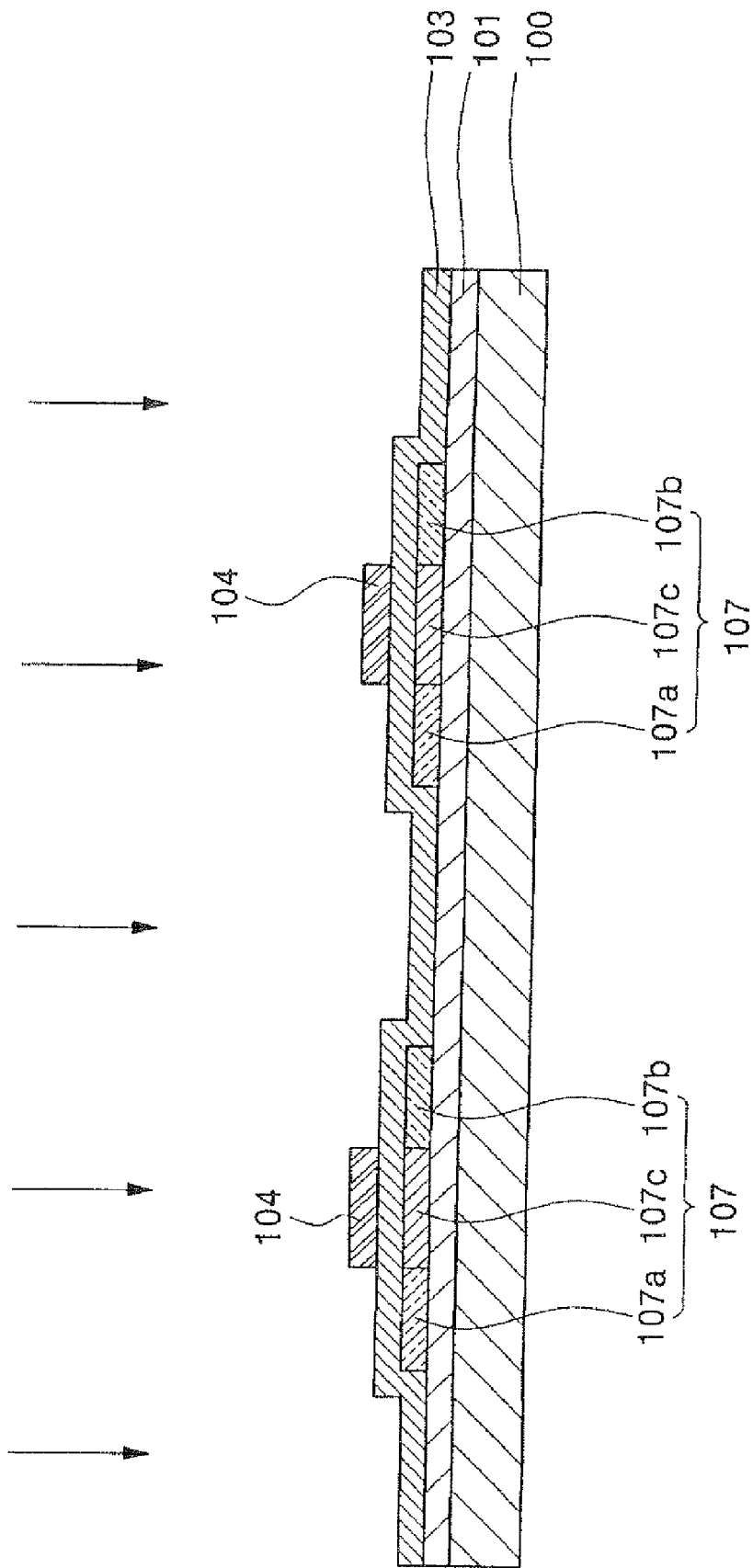

US 8,053,297 B2

METHOD OF FABRICATING A THIN FILM TRANSISTOR USING JOULE HEAT FROM THE GATE ELECTRODE TO FORM A CRYSTALLIZED CHANNEL REGION

CROSS-REFERENCE TO RELATED APPLICATIONS AND CLAIM OF PRIORITY

This application is a divisional of Applicant's Ser. No. 11/987,998 entitled Thin Film Transistor, Method of Fabricating the Same, and Organic Light Emitting Display Device Including the Same filed in the U.S. Patent & Trademark Office on 6 Dec. 2007, and assigned to the assignee of the above-captioned application. Furthermore, this application makes reference to, incorporates the same herein, and claims all benefits accruing under 35 U.S.C. §119, §120 and §121 from the aforesaid Applicant's Ser. No. 11/987,998 and from an application for THIN FILM TRANSISTOR, METHOD OF FABRICATING THE SAME, AND ORGANIC LIGHT EMITTING DISPLAY DEVICE INCLUDING THE SAME earlier filed in the Korean Intellectual Property Office on 6 Dec. 2006 and there duly assigned Serial No. 10-2006-0123078.

BACKGROUND OF THE INVENTION

1. Field of the Invention

The present invention relates to a thin film transistor (TFT), a method for fabricating the TFT, and an organic light emitting display device (OLED) constructed with the TFT, and more particularly, to a TFT which is fabricated using Joule's heat to improve its characteristics, a method for fabricating the TFT, and an OLED constructed with the TFT.

2. Description of the Related Art

In recent years, much attention has been paid to flat panel display devices (FPDs) that can overcome the problems faced by contemporary heavy and large-sized display devices such as a cathode ray tube (CRT) display. The FPDs may be a liquid crystal display device (LCD), an organic light emitting display device (OLED) or a plasma display panel (PDP).

The FPDs are typically constructed with a thin film transistor (TFT), which is required to operate at high speed in response to a given signal and is required to exhibit uniform characteristics over the entire substrate of the TFT. In order to satisfy these requirements, it is most important to control the characteristics of a semiconductor layer of the TFT.

The semiconductor layer is typically constructed by crystallizing amorphous silicon (a-Si) into a polycrystalline silicon (poly-Si) layer. The crystallization of the semiconductor layer may be performed using a solid phase crystallization (SPC) process, an excimer laser annealing (ELA) process, a metal induced crystallization (MIC) process or a metal induced lateral crystallization (MILC) process. Specifically, the SPC process includes a step of annealing an a-Si layer for several to several tens of hours at temperatures below 700° C. where a glass substrate used in the TFT may be undesirably deformed. The ELA process includes a step of partially heating an a-Si layer to reach a high temperature in a short time by irradiating excimer lasers on the a-Si layer. The MIC process includes a step of bringing a metal such as nickel (Ni), palladium (Pd), gold (Au) or aluminum (Al) into contact with an a-Si layer, or a step of injecting the metal into the a-Si layer to induce a phase change of the a-Si layer into a poly-Si layer. The MILC process includes a step of sequentially inducing the crystallization of an a-Si layer while laterally diffusing silicide obtained by a reaction between a metal and silicon.

Since the SPC process involves annealing a substrate at a high temperature for a long period of time, the substrate may be seriously damaged. Also, the ELA process requires expensive laser apparatuses and a high maintenance fee. Further, both the MIC and MILC processes consume too much time in order to crystallize an a-Si layer into a poly-Si layer.

SUMMARY OF THE INVENTION

It is therefore an object of the present invention to provide an improved thin film transistor (TFT).

It is another object to provide a TFT, which is fabricated using Joule's heat to improve its characteristics, a method for fabricating the TFT, and an organic light emitting display device (OLED) constructed with the TFT fabricated with Joule's heat.

According to one aspect of the present invention, a thin film transistor (TFT) may be constructed with a substrate, a semiconductor layer disposed on the substrate and including a channel region and source and drain regions, a gate insulating layer disposed on the semiconductor layer, a gate electrode disposed on the gate insulating layer in correspondence with the channel region, an interlayer insulating layer disposed on the gate electrode, and source and drain electrodes electrically connected to the source and drain regions of the semiconductor layer. The channel region is made from polycrystalline silicon (poly-Si), and the source and drain regions are made from amorphous silicon (a-Si). The polycrystalline silicon of the channel region may be formed by crystallizing amorphous silicon by using Joule's heat produced by the gate electrode.

According to another aspect of the present invention, a method for fabricating a TFT includes providing a substrate, forming an a-Si layer on the substrate, forming a semiconductor layer by patterning the a-Si layer, forming a gate insulating layer on the entire surface of the substrate, forming a gate electrode corresponding to a certain region of the semiconductor layer on the gate insulating layer, crystallizing the certain region of the semiconductor layer using Joule's heat of the gate electrode, forming an interlayer insulating layer on the entire surface of the substrate, and forming source and drain electrodes to be electrically connected to the semiconductor layer.

According to yet another aspect of the present invention, an organic light emitting display device (OLED) is constructed with a substrate, a semiconductor layer disposed on the substrate and including a channel region made from poly-Si and source and drain regions made from a-Si, a gate insulating layer disposed on the semiconductor layer, a gate electrode disposed on the gate insulating layer and corresponding to the channel region, an interlayer insulating layer disposed on the gate electrode, source and drain electrodes electrically connected to the source and drain regions of the semiconductor layer, a first electrode electrically connected to the source and drain electrodes, and an organic layer and a second electrode disposed on the first electrode. The polycrystalline silicon of the channel region may be formed by crystallizing amorphous silicon by using Joule's heat produced by the gate electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 1A, 1B, 1D, and 1E are a sequence of cross-sectional views of a thin film transistor (TFT) during a series of steps performed during a fabricating process according to the principles of the present invention;

FIG. 1C is a plan view of the TFT shown in FIG. 1B;

DETAILED DESCRIPTION OF THE INVENTION

Figure 1A:
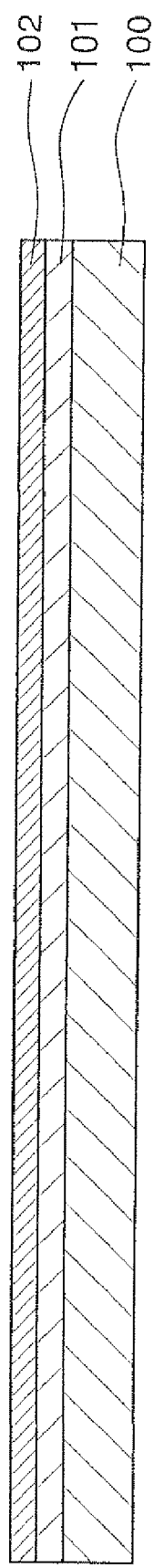

The present invention will now be described more fully hereinafter with reference to the accompanying drawings, in which exemplary embodiments of the invention are shown. In the drawings, the lengths and thicknesses of layers and regions may be exaggerated for clarity. The same reference numerals are used to denote the same elements.

Figure 1B:
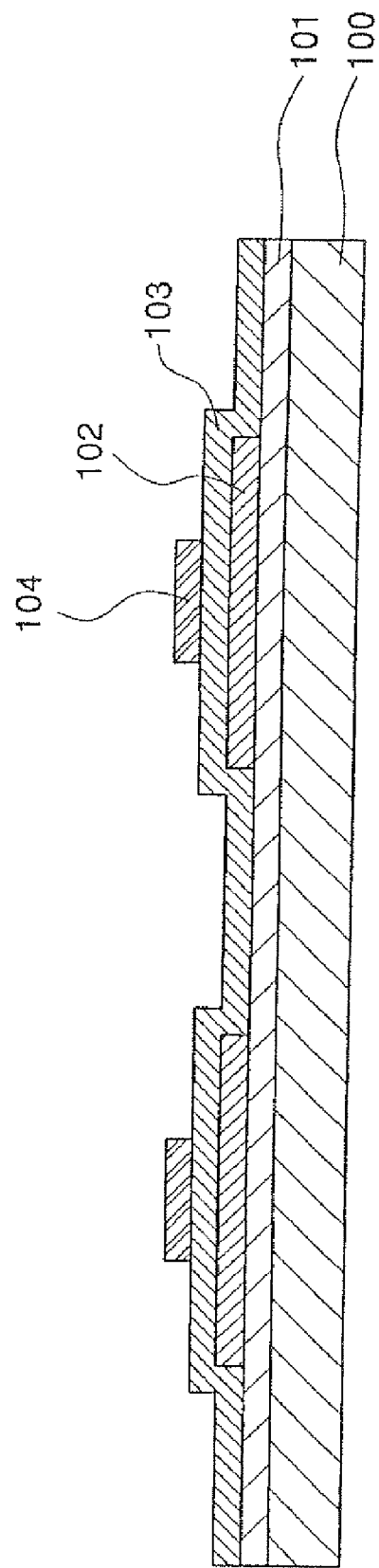

FIGS. 1A, 1B, 1D, and 1E are cross-sectional views of a thin film transistor (TFT) during a fabricating process performed according to the principles of the present invention, and FIG. 1C is a plan view of the TFT shown in FIG. 1B.

Referring to FIG. 1A, a buffer layer 101 is formed on a transparent substrate 100, such as an insulating glass substrate or a plastic substrate. Subsequently, an amorphous silicon (a-Si) layer 102 is formed on buffer layer 101. Buffer layer 101 prevents diffusion of moisture or impurities of substrate 100 from penetrating into a-Si layer 102, and controls a transmission rate of heat during a subsequent crystallization process, thus facilitating the subsequent crystallization process for forming a polycrystalline (poly-Si) layer. Buffer layer 101 may be a silicon oxide layer, a silicon nitride layer or a combination of a silicon oxide layer and a silicon nitride layer.

A-Si layer 102 may be formed by using a chemical vapor deposition (CVD) process or a physical vapor deposition (PVD) process. During or after the formation of a-Si layer 102, a-Si layer 102 may be dehydrogenated to lower the concentration of hydrogen.

A-Si layer 102 may be patterned to form a semiconductor layer 107. In this case, a region of a-Si layer 102 disposed under a gate electrode (not shown in FIG. 1A) may be crystallized, by a subsequent crystallization process, into a poly silicon (poly-Si) region and be used as a channel region, while the remaining regions of a-Si layer 102 may be used as source and drain regions. Therefore, a-Si layer 102 includes a channel region, a source region and a drain regions.

Referring to FIG. 1B, a gate insulating layer 103 is formed on the entire surface of substrate 100. Gate insulating layer 103 protects the surface of a-Si layer 102 and prevents the emission of heat during a subsequent crystallization process. Gate insulating layer 103 may be a silicon oxide layer or a silicon nitride layer, which is formed using a CVD process or a PVD process.

Gate insulating layer 103 may be formed to have a thickness of approximately 800 Å to approximately 1500 Å. Gate insulating layer 103 may be more than approximately 800 Å since gate insulating layer 103 can thereby obtain excellent characteristics when a TFT is completely formed. Also, gate insulating layer 103 may be less than approximately 1500 Å to allow Joule's heat to transmit through gate insulating layer 103 to semiconductor layer 107 during a subsequent crystallization process.

Thereafter, a metal layer (not shown) is formed on gate insulating layer 103. The metal layer is made from aluminum (Al), silver (Ag), titanium (Ti), tungsten (W), molybdenum (Mo) or a combination of these metals. The metal layer is patterned to form a plurality of gate electrodes 104.

When an electric power is applied to gate electrode 104, gate electrode 104 functions as a metal structure that generates Joule's heat due to the applied power. Thus, gate electrode 104 generates high-temperature Joule's heat due to the application of power. In other words, gate electrode 104 serves as a thin-film heater that generates heat using power (i.e., electricity). As described above, gate electrode 104 may be made from a metal that is appropriately resistive and highly thermal conductive, and will not be oxidized at a high temperature.

Referring to FIG. 1C, a positive electrode 105a and a negative electrode 105b are temporarily formed at both end regions of gate electrode 104 and are connected to a power supply 106 in order to apply power W to gate electrode 104. In this case, when gate electrode 104 is patterned in a rectangular shape, positive electrode 105a is formed at one end of the major axis of the rectangular shape, and negative electrode 105b is formed at the other end of the major axis of the rectangular shape.

Thereafter, power is supplied from power supply 106 through positive electrode and negative electrode 105a and 105b to gate electrode 104. When the power is applied to gate electrode 104, Joule's heat is generated due to the resistance of gate electrode 104. Particularly, Joule's heat is generated mainly in gate electrode 104.

Here, Joule's heat is proportional to the applied power. As expressed in Equation 1, the Joule's heat is proportional to the power W that is a product of voltage V and current A:

$$\text{Jouleheat} \propto \text{power}(W) = \text{voltage}(V) \times \text{current}(A) \tag{1}$$

The Joule's heat generated due to the applied power is transmitted to gate insulating layer 103 disposed under gate electrode 104 and subsequently transmitted to a-Si layer 102 disposed under gate insulating layer 103. In this case, the transmitted Joule's heat is linearly proportional to applied power W as expressed in Equation 1.

The transmitted Joule's heat is applied to a-Si layer 102 to raise a temperature of a-Si layer 102 to a high temperature having a range of approximately 700° C. to 900° C. in several to several tens of seconds. In this case, a portion of a-Si layer 102, which is disposed directly under gate electrode 104, is heated and crystallized into a poly-Si layer. The remaining portion of a-Si layer 102, however, is not crystallized.

FIGS. 2A through 2D are photographic images of an a-Si layer in a process of crystallization over time according to an exemplary embodiment of the principles of the present invention.

In the exemplary embodiment of the present invention, gate electrode 104 is formed to have a linewidth of 300 μm, and a voltage of 175 V is applied to gate electrode 104.

Figure 2A:
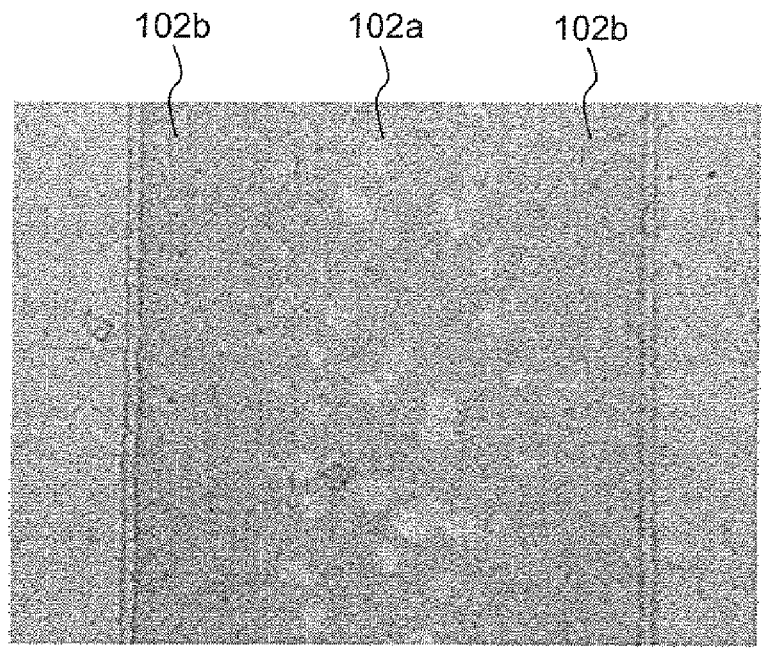
FIGS. 2A through 2D and 3 are photographic images showing polycrystalline silicon (poly-Si) during a crystallization process according to an exemplary embodiment of the principles of the present invention.
Figure 2B:
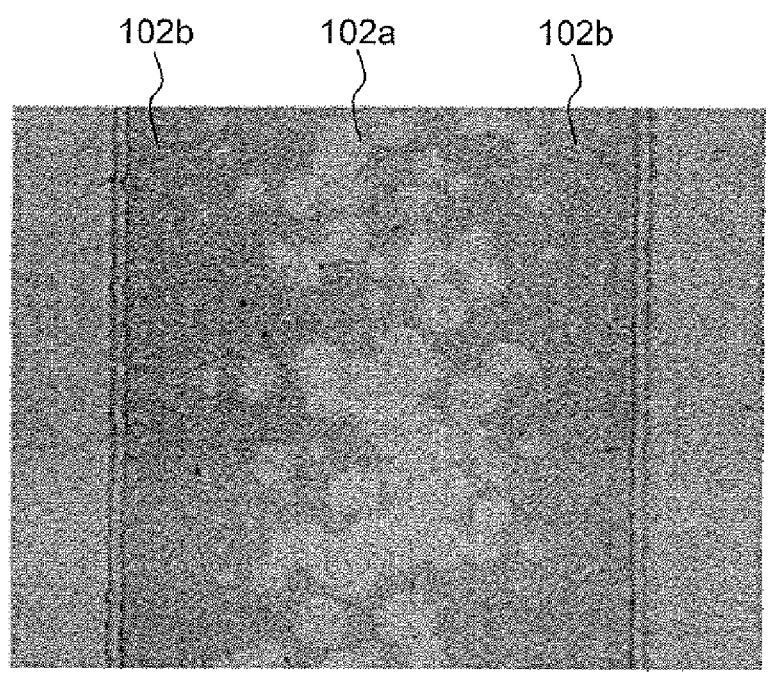

FIG. 2A shows an initial stage of the crystallization process in which a region 102a of a-Si layer 102 disposed under gate electrode 104 has been crystallized for 20 seconds so that nuclei are partially grown. Referring to FIG. 2B, region 102a of a-Si layer 102 disposed under gate electrode 104 has been crystallized for 20 seconds more than the region shown in FIG. 2A (i.e., has been crystallized for 40 seconds).

Figure 2C:
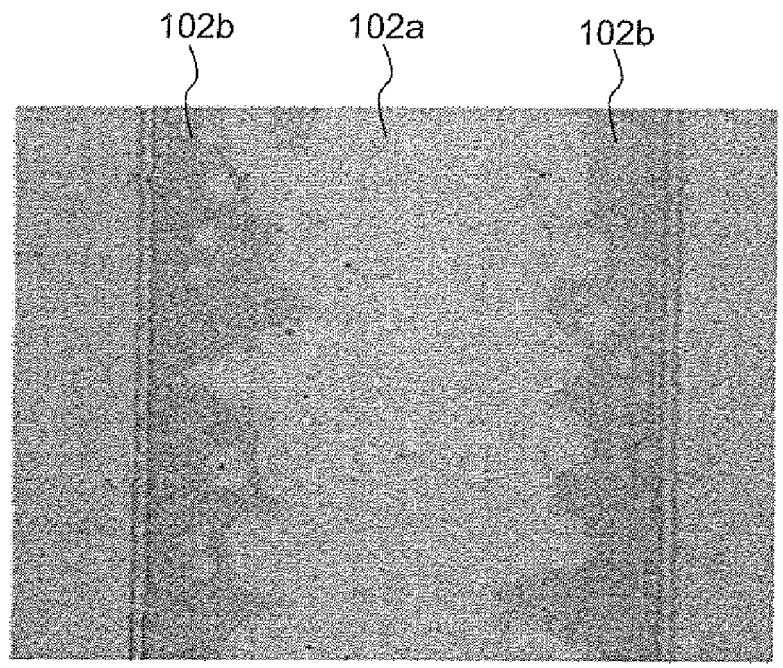

Referring to FIG. 2C, region 102a of a-Si layer 102 disposed under gate electrode 104 has been crystallized for 20 seconds more than the region shown in FIG. 2B (i.e., has been crystallized for 60 seconds).

Figure 2D:
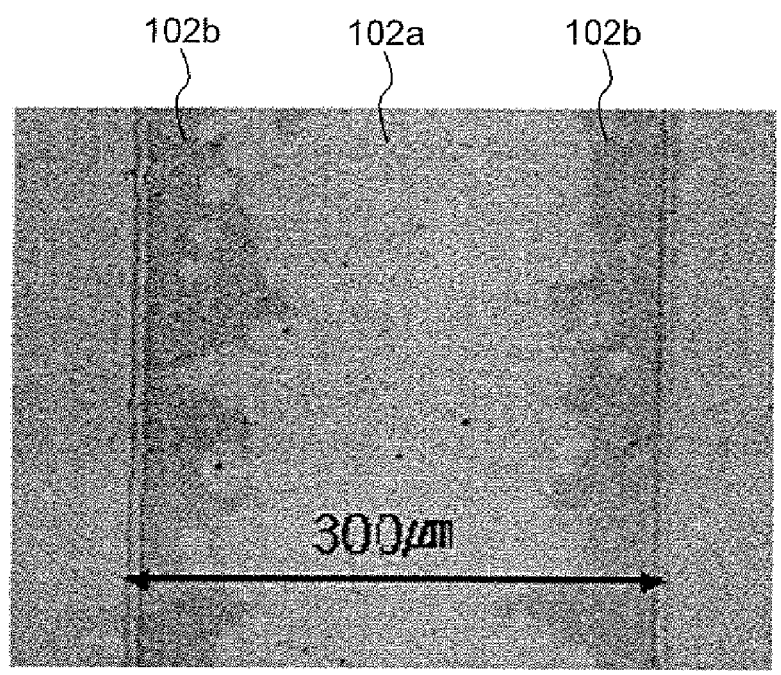

Referring to FIG. 2D, region 102a of a-Si layer 102 disposed under gate electrode 104 has been crystallized for 20 seconds more than the region shown in FIG. 2C (i.e., has been crystallized for 80 seconds). As shown in FIGS. 2A through 2D, the remaining region 102b of a-Si layer 102 on which gate electrode 104 was not formed, was not crystallized.

That is, since region 102a of a-Si layer 102 on which gate electrode 104 is formed may function as a channel region later, only a desired region of a-Si layer 102 may be selectively crystallized by controlling a position in which gate electrode 104 is formed. Thus a driver integrated circuit (IC) region, which requires high mobility, may be crystallized to facilitate the fabrication of system on glass (SOG) display devices.

In addition, a-Si layer 102 can be crystallized in a short amount of time, thus preventing substrate 100 (for example, a glass substrate) from deforming.

Figure 3:
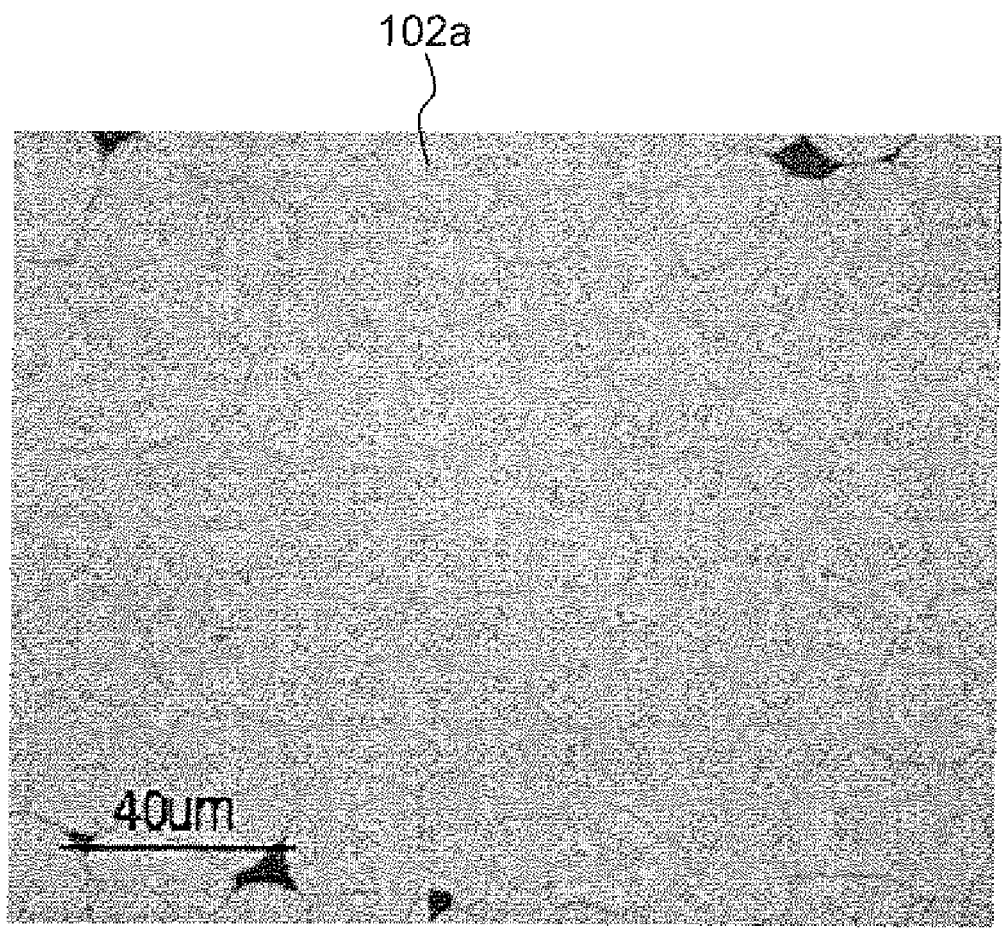

FIG. 3 is a photographic image of a poly-Si layer that is crystallized according to the exemplary embodiment of the principles of the present invention.

Referring to FIG. 3, it can be seen that the poly-Si layer, which is crystallized using Joule's heat according to the present exemplary embodiment, has a very large grain size of about 40 μm. Accordingly, a poly-Si layer with few grain boundaries can be fabricated, and the characteristics of the TFT can be enhanced.

Next, referring to FIG. 1D, after the crystallization process is finished and positive and negative electrodes 105a and 105b are removed, impurity ions with a certain conductivity type are implanted into the entire surface of substrate 100 using gate electrode 104 as an ion implantation mask, thereby forming source and drain regions 107a and 107b and channel region 107c. In order to form the TFT, the impurity ions may be p-type impurity ions or n-type impurity ions. The p-type impurity ions may be selected from the group consisting of boron (B), aluminum (Al), gallium (Ga) and indium (In), while the n-type impurity ions may be selected from the group consisting of phosphorus (P), arsenic (As) and antimony (Sb).

Because channel region 107c of semiconductor layer 107 disposed under gate electrode 104 is crystallized in the prior process, channel region 107c disposed under gate electrode 104 corresponds to a poly-Si region, while source and drain regions 107a and 107b correspond to a-Si regions.

Figure 1E:
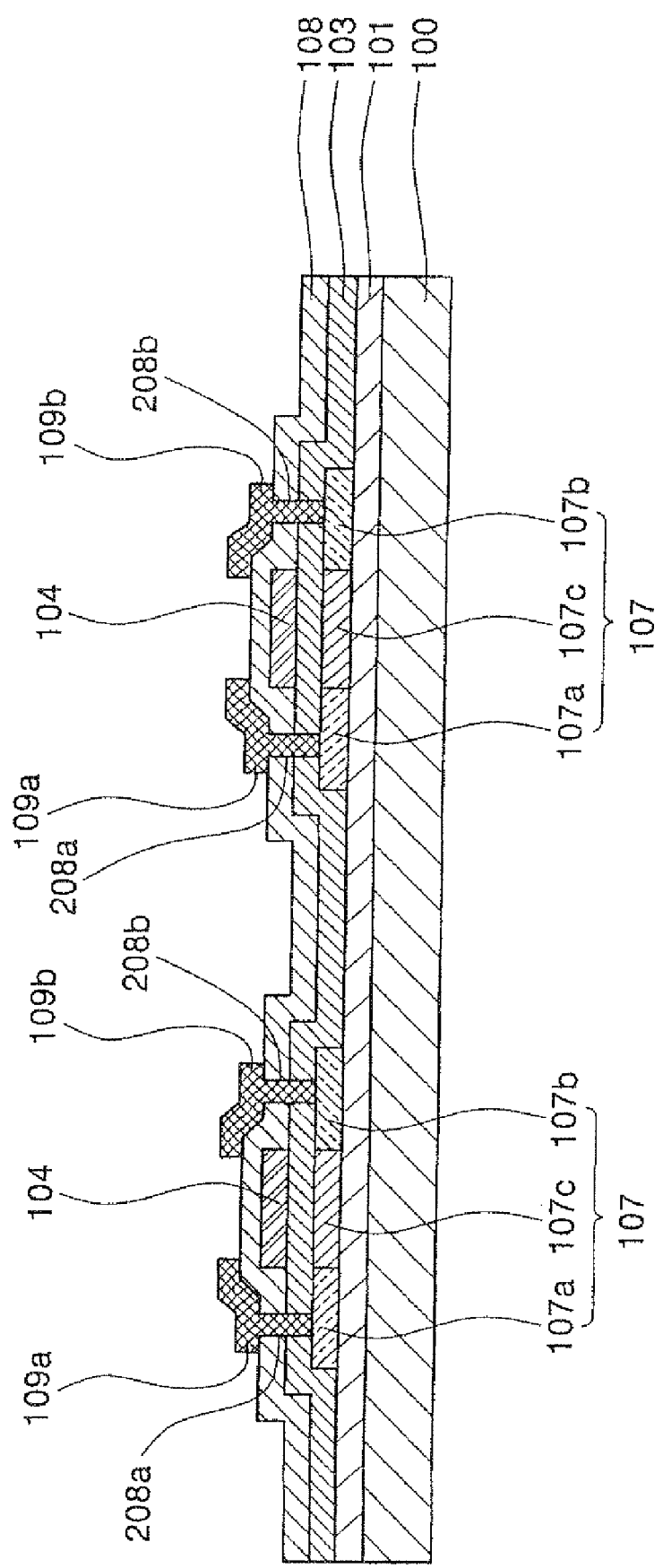

Referring to FIG. 1E, an interlayer insulating layer 108 is formed on the entire surface of substrate 100 including gate insulating layer 103 and gate electrode 104.

Thereafter, certain regions of interlayer insulating layer 108 and gate insulating layer 103 are etched to form contact holes 208a and 208b. Source and drain electrodes 109a and 109b are formed such that source and drain electrodes 109a and 109b are electrically connected to source and drain electrodes 107a and 107b through contact holes 208a and 208b, respectively. Through this process, the TFT is completely constructed according to the first embodiment of the present invention.

As mentioned above, a desired region of an a-Si layer may be selectively crystallized into a poly-Si region during the fabrication of the TFT according to the first embodiment of the principles of the present invention. As a result, a driver IC region (i.e., the semiconductor layer) requiring high mobility can be crystallized, thus facilitating the fabrication of SOG display devices.

Also, since the a-Si layer may be crystallized in a short amount of time, the deformation of a substrate, such as a glass substrate, can be prevented.

Further, a poly-Si region with small grain boundaries may be fabricated, so that the characteristics of the TFT can be enhanced.

Figure 4:
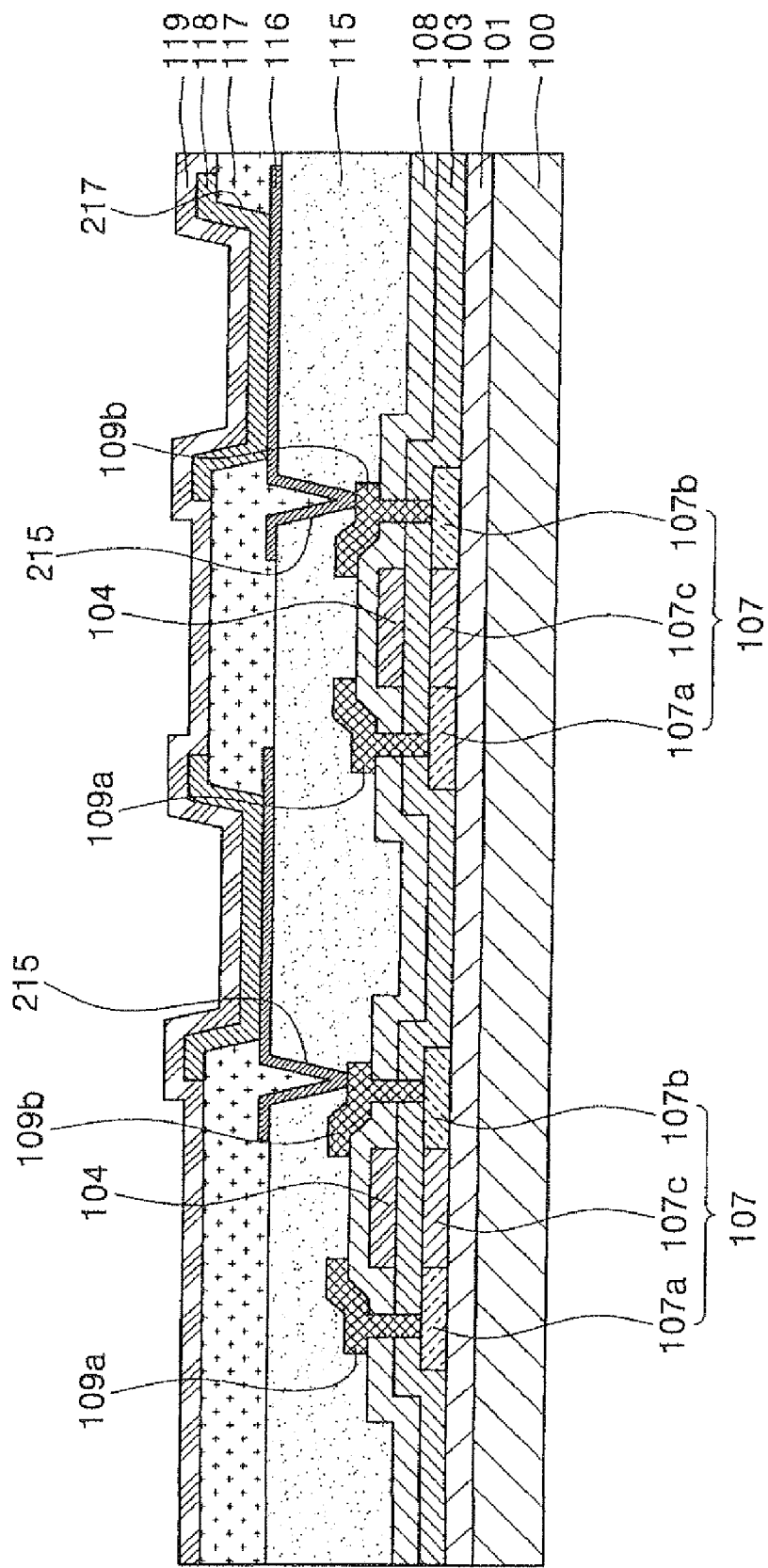
FIG. 4 is a cross-sectional view of an organic light emitting display device (OLED) constructed as an embodiment of the principles of the present invention.

FIG. 4 is a cross-sectional view of an organic light emitting display device (OLED) constructed as an exemplary embodiment according to the principles of the present invention.

Referring to FIG. 4, a planarization layer 115 is formed on the entire surface of substrate 100. Planarization layer 115 may be an organic layer, an inorganic layer or a combination of an organic layer and inorganic layer. For example, planarization layer 115 may be made from an inorganic material, such as spin on glass (SOG) material, or an organic material, such as acryl resin, polyimide resin or benzocyclobutene (BCB).

Planarization layer 115 may be etched to form via hole 215 to expose either one of source and drain electrodes 109a and 109b. A first electrode 116 may be formed in via hole 215 and electrically connect to the exposed one of source and drain electrodes 109a and 109b. Specifically, first electrode 116 is formed on a bottom surface of via hole 215 in electrical contact with the exposed one of source electrode 109a and drain electrode 109b and extends onto planarization layer 115. First electrode 116 may be made from indium tin oxide (ITO) or indium zinc oxide (IZO).

Subsequently, a pixel defining layer 117 is formed on the entire surface of substrate 100 including first electrode 116. In this case, pixel defining layer 117 is formed to have a sufficient thickness so as to fill via hole 215 in which first electrode 116 is formed. Pixel defining layer 117 may be an organic layer or an inorganic layer. Preferably, pixel defining layer 117 is an organic layer. More preferably, pixel defining layer 117 may be one selected from the group that includes BCB, acryl polymer and polyimide. Since pixel defining layer 117 has high flowability, pixel defining layer 117 may be planarized on the entire surface of substrate 100.

Pixel defining layer 117 may be etched to form opening 217 in order to expose first electrode 116. An organic layer 118 may be formed on first electrode 116 that is exposed by the opening. Organic layer 118 may include at least an emission layer and may further include at least one of a hole injection layer, a hole transport layer, an electron transport layer and an electron injection layer.

Thereafter, a second electrode 119 is formed on the entire surface of substrate 100. Second electrode 119 is a transmissive electrode, which is made from a transparent material with a small work function, for example, one selected from the group that includes magnesium (Mg), silver (Ag), aluminum (Al), calcium (Ca) and an alloy thereof.

Through this process, the OLED is completely constructed according to the principles of the present invention.

According to the present invention as described above, a poly-Si layer having an excellent crystalline characteristic can be formed, and a TFT with good characteristics can be fabricated.

Also, a driver IC region may be crystallized to enable the fabrication of system on glass (SOG) display devices.

Further, since an a-Si layer may be crystallized to form a poly-Si layer in a short amount of time, the deformation of a substrate, such as a glass substrate, can be prevented.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method for fabricating a thin film transistor (TFT), comprising:
    providing a substrate;
    forming an amorphous silicon (a-Si) layer on the substrate;
    forming a semiconductor layer by patterning the a-Si layer;
    forming a gate insulating layer on the entire surface of the substrate;
    forming a gate electrode on the gate insulating layer, with the gate electrode corresponding to a certain region of the semiconductor layer;
    crystallizing the certain region of the semiconductor layer using Joule's heat of the gate electrode to form a crystallized region;
    forming an interlayer insulating layer on the entire surface of the substrate; and
    forming source and drain electrodes to be electrically connected to the semiconductor layer.

2. The method according to claim 1, with the crystallized region of the semiconductor layer being used to form a channel region, and the remaining a-Si region of the semiconductor layer being used to form source and drain regions.

3. The method according to claim 1, after crystallizing the certain region of the semiconductor layer, further comprising forming source and drain regions by implanting impurity ions into the remnants of the a-Si region of the semiconductor layer that has not been crystallized.

4. The method according to claim 1, with crystallizing the semiconductor layer using the Joule's heat of the gate electrode comprising:
    electrically connecting a positive electrode and a negative electrode to respective end regions of the gate electrode; and
    applying an electric power to the positive electrode and the negative electrode.

5. The method according to claim 4, with the Joule's heat being linearly proportional to the applied electric power.

6. The method according to claim 1, with the Joule's heat ranging from about 700° C. to about 900° C.

7. The method according to claim 1, with the semiconductor layer being used for a driver circuit region.

8. The method according to claim 1, further comprising forming a buffer layer before forming the a-Si layer.

* * * * *